United States Patent
Pandey et al.

(10) Patent No.: US 12,158,435 B2
(45) Date of Patent: Dec. 3, 2024

(54) ILLUMINATION AND DETECTION APPARATUS FOR A METROLOGY APPARATUS

(71) Applicant: ASML NETHERLANDS B.V., Veldhoven (NL)

(72) Inventors: Nitesh Pandey, San Jose, CA (US); Simon Gijsbert Josephus Mathijssen, Rosmalen (NL); Kaustuve Bhattacharyya, Veldhoven (NL); Arie Jeffrey Den Boef, Waalre (NL)

(73) Assignee: ASML NETHERLANDS B.V., Veldhoven (NL)

( * ) Notice: Subject to any disclaimer, the term of this patent is extended or adjusted under 35 U.S.C. 154(b) by 130 days.

(21) Appl. No.: 17/634,588

(22) PCT Filed: Jul. 14, 2020

(86) PCT No.: PCT/EP2020/069844
§ 371 (c)(1),
(2) Date: Feb. 11, 2022

(87) PCT Pub. No.: WO2021/032366
PCT Pub. Date: Feb. 25, 2021

(65) Prior Publication Data
US 2022/0276180 A1    Sep. 1, 2022

(30) Foreign Application Priority Data

Aug. 19, 2019   (EP) .................................... 19192284

(51) Int. Cl.
*G01J 3/36*        (2006.01)
*G01N 21/95*       (2006.01)
(Continued)

(52) U.S. Cl.
CPC ............ *G01N 21/9505* (2013.01); *G01J 3/36* (2013.01); *G02B 27/1006* (2013.01); *G02B 27/145* (2013.01); *G03F 7/70616* (2013.01)

(58) Field of Classification Search
None
See application file for complete search history.

(56) References Cited

U.S. PATENT DOCUMENTS 6,952,253 B2   10/2005   Lof et al.
8,830,472 B2   9/2014    Den Boef et al.
(Continued)

FOREIGN PATENT DOCUMENTS

CN   102967998   3/2013
CN   105612460   5/2016
(Continued)

OTHER PUBLICATIONS

International Search Report and Written Opinion issued in corresponding PCT Patent Application No. PCT/EP2020/069844, dated Oct. 20, 2020.
(Continued)

*Primary Examiner* — Eileen M Adams
(74) *Attorney, Agent, or Firm* — Pillsbury Winthrop Shaw Pittman, LLP

(57) ABSTRACT

An illumination and detection apparatus for a metrology tool, and associated method. The apparatus includes an illumination arrangement operable to produce measurement illumination having a plurality of discrete wavelength bands and having a spectrum having no more than a single peak within each wavelength band. The detection arrangement includes a detection beamsplitter to split scattered radiation into a plurality of channels, each channel corresponding to a different one of the wavelength bands; and at least one detector for separate detection of each channel.

20 Claims, 4 Drawing Sheets

(51) Int. Cl.
*G02B 27/10* (2006.01)
*G02B 27/14* (2006.01)
*G03F 7/00* (2006.01)

(56) References Cited

U.S. PATENT DOCUMENTS

| | | |
|---|---|---|
| 8,891,061 B2 | 11/2014 | Leewis et al. |
| 10,132,684 B1* | 11/2018 | Van Derslice ........ G01J 3/0235 |
| 2003/0012246 A1* | 1/2003 | Klimek .................... H01S 5/18 |
| | | 359/345 |
| 2003/0038923 A1 | 2/2003 | Aastuen et al. |
| 2003/0048423 A1 | 3/2003 | Aastuen et al. |
| 2004/0207824 A1 | 10/2004 | Lof et al. |
| 2010/0328655 A1 | 12/2010 | Den Boef |
| 2011/0026032 A1 | 2/2011 | Den Boef et al. |
| 2011/0102753 A1 | 5/2011 | Van De Kerkhof et al. |
| 2011/0249244 A1 | 10/2011 | Leewis et al. |
| 2012/0044470 A1 | 2/2012 | Smilde et al. |
| 2013/0201486 A1* | 8/2013 | Mathijssen ........ G01B 9/02015 |
| | | 356/486 |
| 2013/0308198 A1* | 11/2013 | Erdogan ............. G02B 27/1006 |
| | | 359/640 |
| 2016/0223920 A1* | 8/2016 | Tinnemans ........ G01B 9/02015 |
| 2017/0315456 A1 | 11/2017 | Lin et al. |
| 2017/0322497 A1 | 11/2017 | Lin et al. |
| 2018/0341105 A1 | 11/2018 | Sobolev |
| 2019/0010778 A1 | 1/2019 | Shampine |
| 2019/0107781 A1 | 4/2019 | Stichting et al. |
| 2019/0113852 A1 | 4/2019 | Ravensbergen et al. |
| 2020/0049564 A1* | 2/2020 | McLaren .................. G01J 5/48 |
| 2022/0035257 A1 | 2/2022 | Goorden et al. |

FOREIGN PATENT DOCUMENTS

| | | |
|---|---|---|
| EP | 1628164 | 2/2006 |
| EP | 3276419 | 1/2018 |
| WO | 2017097564 | 6/2017 |
| WO | 2018036828 | 3/2018 |

OTHER PUBLICATIONS

Anonymous, "Research Disclosure," Research Disclosure, No. 592052 (Aug. 1, 2013).

Office Action issued in corresponding Israeli Patent Application No. 290410, dated Jan. 15, 2024.

Office Action issued in corresponding Chinese Patent Application No. 202080058446.3, dated Mar. 1, 2024.

* cited by examiner

ILLUMINATION AND DETECTION APPARATUS FOR A METROLOGY APPARATUS

CROSS-REFERENCE TO RELATED APPLICATIONS

This application is the U.S. national phase entry of PCT Patent Application No. PCT/EP2020/069844 which was filed on Jul. 14, 2020, which claims the benefit of priority of European Patent Application No. 19192284.8 which was filed on Aug. 19, 2019 and which is incorporated herein in its entirety by reference.

FIELD

The present invention relates to an illumination apparatus and an illumination and detection apparatus for a metrology tool for determining a characteristic of structures on a substrate, and a compound prism therefor. The present invention also relates to a method for determining a characteristic of structures on a substrate.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

In lithographic processes, it is desirable to make frequently measurements of the structures created, e.g., for process control and verification. Various tools for making such measurements are known, including scanning electron microscopes or various forms of metrology apparatuses, such as scatterometers. A general term to refer to such tools may be metrology apparatuses or inspection apparatuses.

To improve measurement robustness, a metrology apparatus may measure using multiple wavelengths. Presently, these multiple wavelengths are typically measured sequentially.

SUMMARY

It is an object to reduce acquisition time and increase throughput when performing metrology using multiple wavelengths.

Embodiments of the invention are disclosed in the claims and in the detailed description.

In a first aspect of the invention there is provided an illumination and detection apparatus for a metrology tool, comprising: an illumination arrangement operable to produce measurement illumination comprising a plurality of discrete wavelength bands and comprising a spectrum having no more than a single peak within each wavelength band; and a detection arrangement comprising: a detection beamsplitter to split scattered radiation into a plurality of channels, each channel corresponding to a different one of said wavelength bands; and at least one detector for separate detection of each channel.

In a second aspect of the invention there is provided an illumination apparatus for a metrology tool and being operable to produce measurement illumination comprising a plurality of discrete wavelength bands and comprising a spectrum having no more than a single peak within each wavelength band; the illumination arrangement comprising: an illumination beamsplitter to split an input beam into plurality of sub-beams, each comprising a respective one of said discrete wavelength bands; a tuning arrangement for individually tuning the spectrum of each sub-beam within its respective wavelength band; and a beam combiner for combining said sub-beams into a beam of said measurement illumination.

In a third aspect of the invention there is provided a compound prism arrangement for outputting radiation in a plurality of different wavelength bands comprising two or more prism elements defining: an input face for receiving broadband illumination; a plurality of output faces for outputting radiation in respective ones of each of said wavelength bands; and splitting faces in an optical path between said input face and at least one of said output faces for splitting an incident beam thereon according to wavelength; wherein said splitting faces comprise edge pass filter coatings.

In a fourth aspect of the invention there is provided a method for performing a measurement of a structure with measurement illumination comprising a plurality of discrete wavelength bands and comprising a spectrum having no more than a single peak within each wavelength band; the method comprising: splitting a broadband radiation beam into a plurality of sub-beams, each having a respective wavelength band; individually tuning each of the wavelength bands to form and locate said peak within its respective wavelength band; combining the sub-beams into a beam of measurement radiation; measuring the structure with the measurement radiation; and capturing the scattered radiation, having been scattered by the structure.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figures 1, 2:
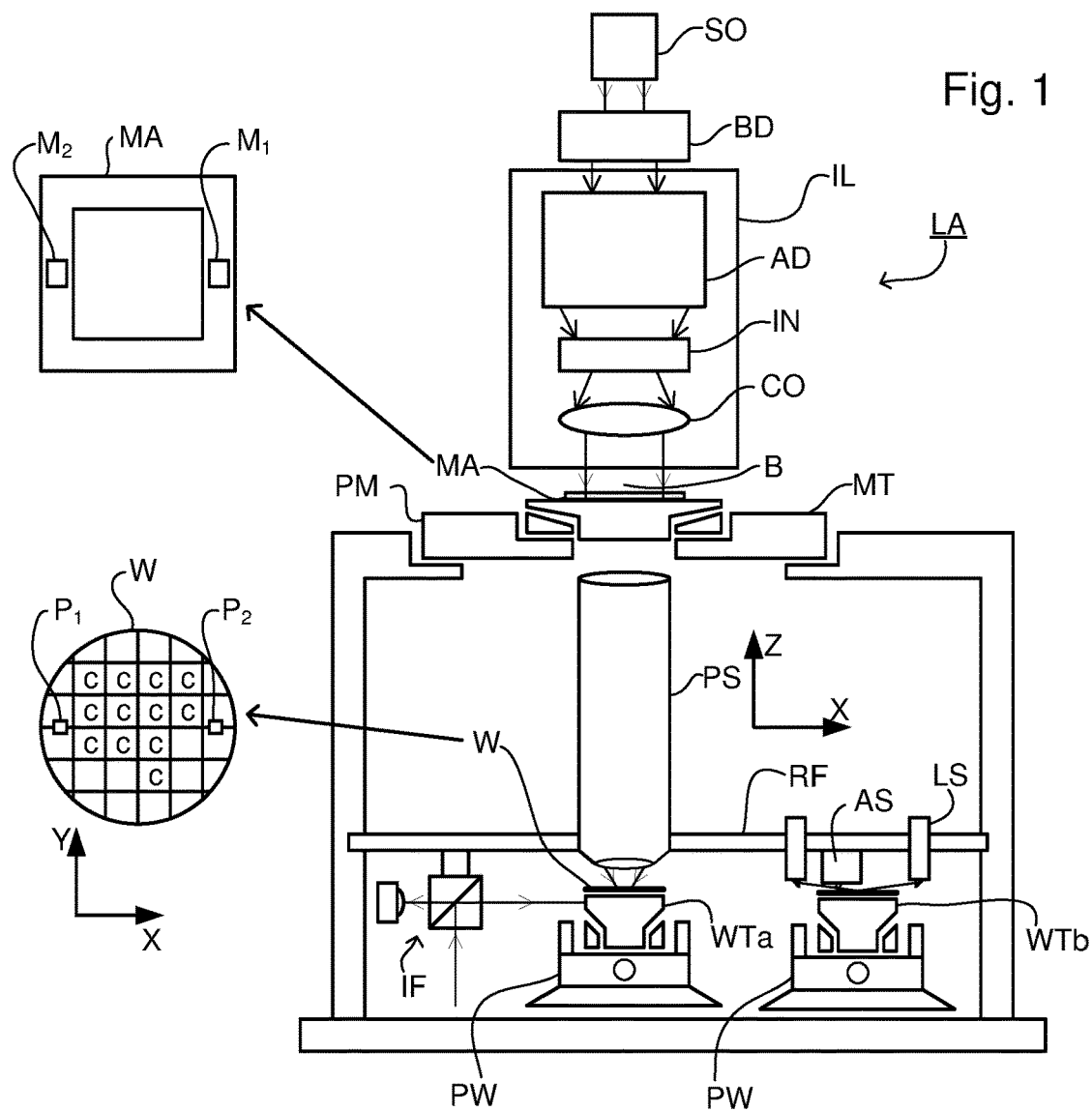
FIG. 1 depicts a schematic overview of a lithographic apparatus.
FIG. 2 depicts a schematic overview of a lithographic cell.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks $M_1$, $M_2$ and substrate alignment marks $P_1$, $P_2$. Although the substrate alignment marks $P_1$, $P_2$ as illustrated occupy dedicated target portions, they may be located in spaces between target portions. Substrate alignment marks $P_1$, $P_2$ are known as scribe-lane alignment marks when these are located between the target portions C.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, 1/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
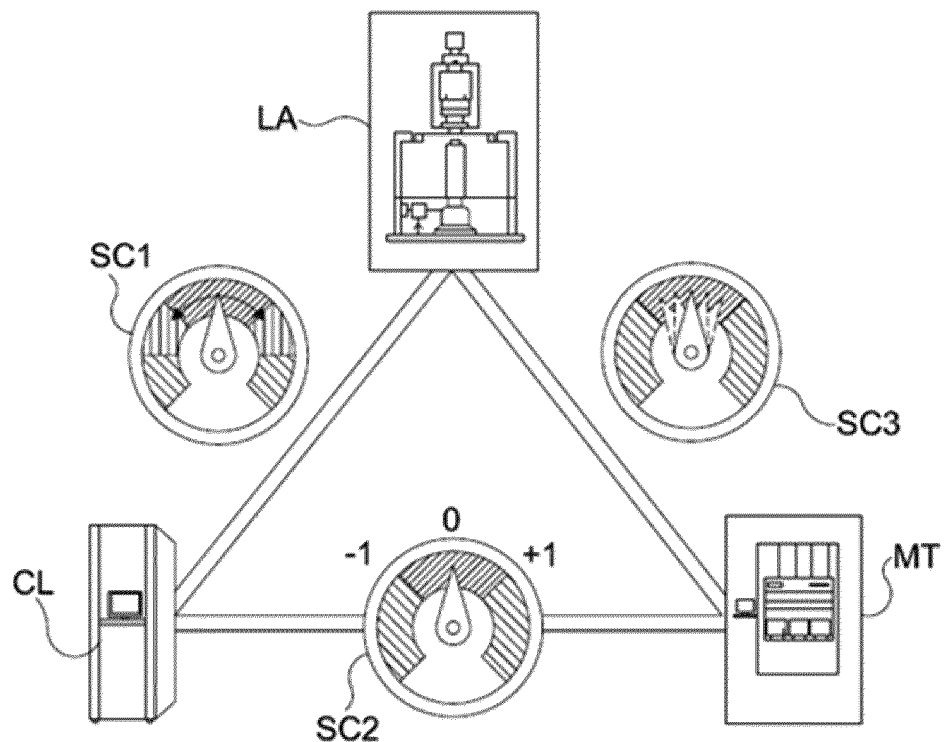
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MET (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MET) to predict whether defects may be present due to e.g. sub-optimal processing (depicted in FIG. 3 by the arrow pointing "0" in the second scale SC2).

The metrology tool MET may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Various tools for making such measurements are known, including scanning electron microscopes or various forms of metrology apparatuses, such as scatterometers. Examples of known scatterometers often rely on provision of dedicated metrology targets, such as underfilled targets (a target, in the form of a simple grating or overlapping gratings in different layers, that is large enough that a measurement beam generates a spot that is smaller than the grating) or overfilled targets (whereby the illumination spot partially or completely contains the target). Further, the use of metrology tools, for example an angular resolved scatterometer illuminating an underfilled target, such as a grating, allows the use of so-called reconstruction methods where the properties of the grating can be calculated by simulating interaction of scattered radiation with a mathematical model of the target structure and comparing the simulation results with those of a measurement. Parameters of the model are adjusted until the simulated interaction produces a diffraction pattern similar to that observed from the real target.

Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers can measure in one image multiple targets from multiple gratings using light from soft x-ray and visible to near-IR wave range.

Figure 4:
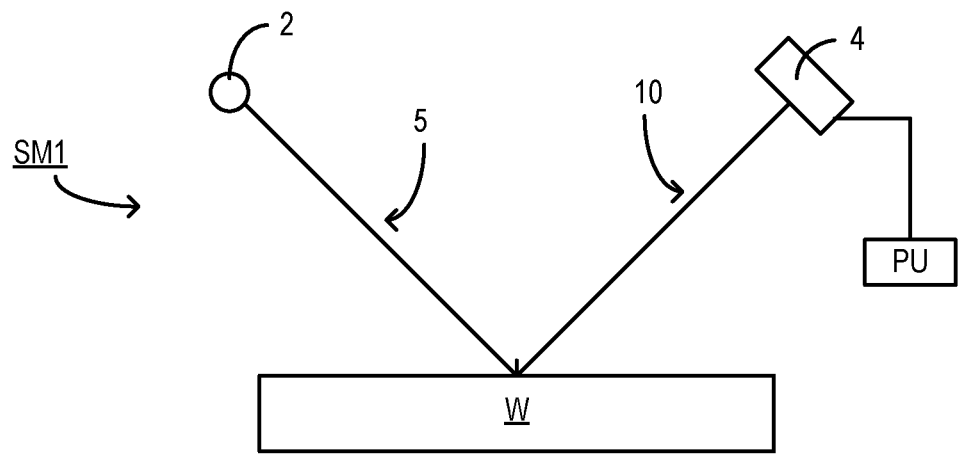
FIG. 4 is a schematic illustration of a scatterometry apparatus.
Figure 4:
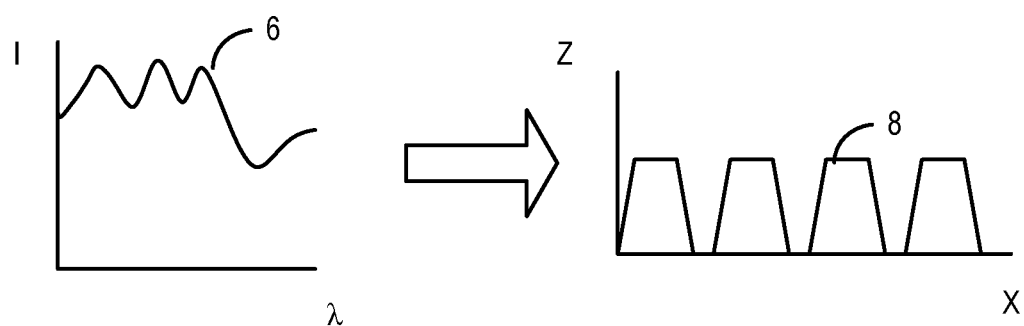

A metrology apparatus, such as a scatterometer, is depicted in FIG. 4. It comprises a broadband (white light) radiation projector 2 which projects radiation 5 onto a substrate W. The reflected or scattered radiation 10 is passed to a spectrometer detector 4, which measures a spectrum 6 (i.e. a measurement of intensity I as a function of wavelength $\lambda$) of the specular reflected radiation 10. From this data, the structure or profile 8 giving rise to the detected spectrum may be reconstructed by processing unit PU, e.g. by Rigorous Coupled Wave Analysis and non-linear regression or by comparison with a library of simulated spectra. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

In many present scatterometer arrangements, multiple wavelengths are used for increased measurement robustness as some targets or structures may present a wavelength dependent error when measured. Measurement of such a target with multiple wavelengths facilitates, for example, identification and selection of a preferred (e.g., most accurate) wavelength and/or quantification and correction for the error.

In many present scatterometer arrangements, the multiple wavelengths are measured sequentially on the detector. However, this has a negative impact on throughput, particularly as the switch time between wavelengths may be long. Therefore a method for parallel measurement of a target at multiple wavelengths is desirable. As such, a method, and associated apparatus, is proposed which comprises illuminating a target using measurement illumination comprising a plurality of different wavelengths, such that each of these wavelengths are used simultaneously in a single measurement capture.

Figure 5:
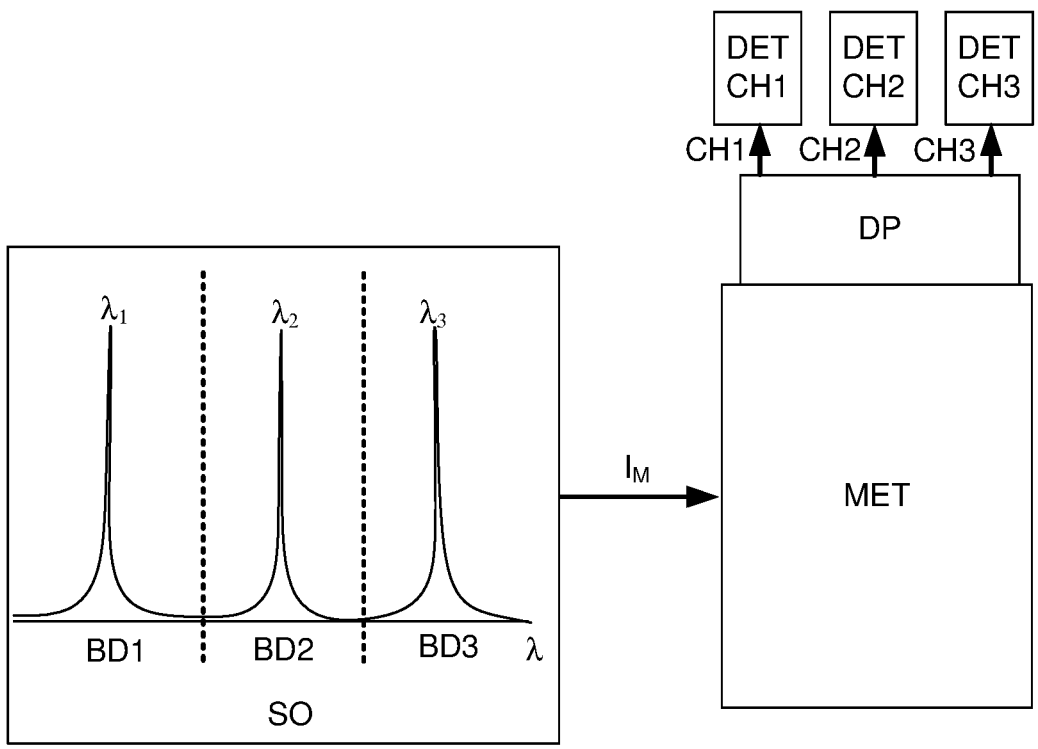
FIG. 5 is a schematic illustration of a metrology apparatus comprising an illumination and detection arrangement according to a first embodiment of the invention.

FIG. 5 is a schematic illustration of an apparatus suitable for achieving this. A source arrangement SO provides measurement illumination $I_M$. The measurement illumination $I_M$ has a spectrum having a narrow peak (a narrow band of wavelengths) at each of a plurality of different wavelengths (here three wavelengths $\lambda_1$, $\lambda_2$, $\lambda_3$) within a respective individual wavelength band BD1, BD2, BD3, such that there is no more than one wavelength peak per band. This measurement illumination $I_M$ is used to measure a target within a metrology device MET (which may comprise any suitable metrology device which uses electromagnetic radiation to measure a target or structure). The scattered radiation from the target is split by a detection beamsplitter or detection prism DP into a plurality of detection channels CH1, CH2, CH3, each channel corresponding to a respective wavelength peak $\lambda_1$, $\lambda_2$, $\lambda_3$ and/or wavelength band BD1, BD2, BD3. Each detection channel comprises a respective detector DET CH1, DET CH2, DET CH3, such as a camera or pixel array, each of which detects an image for its corresponding wavelength band BD1, BD2, BD3.

In this way, the illumination and detection apparatus can separately detect radiation in each channel in parallel (e.g., simultaneously), thereby detecting in parallel, scattered illumination corresponding to each of said wavelength bands during a measurement.

Figure 6:
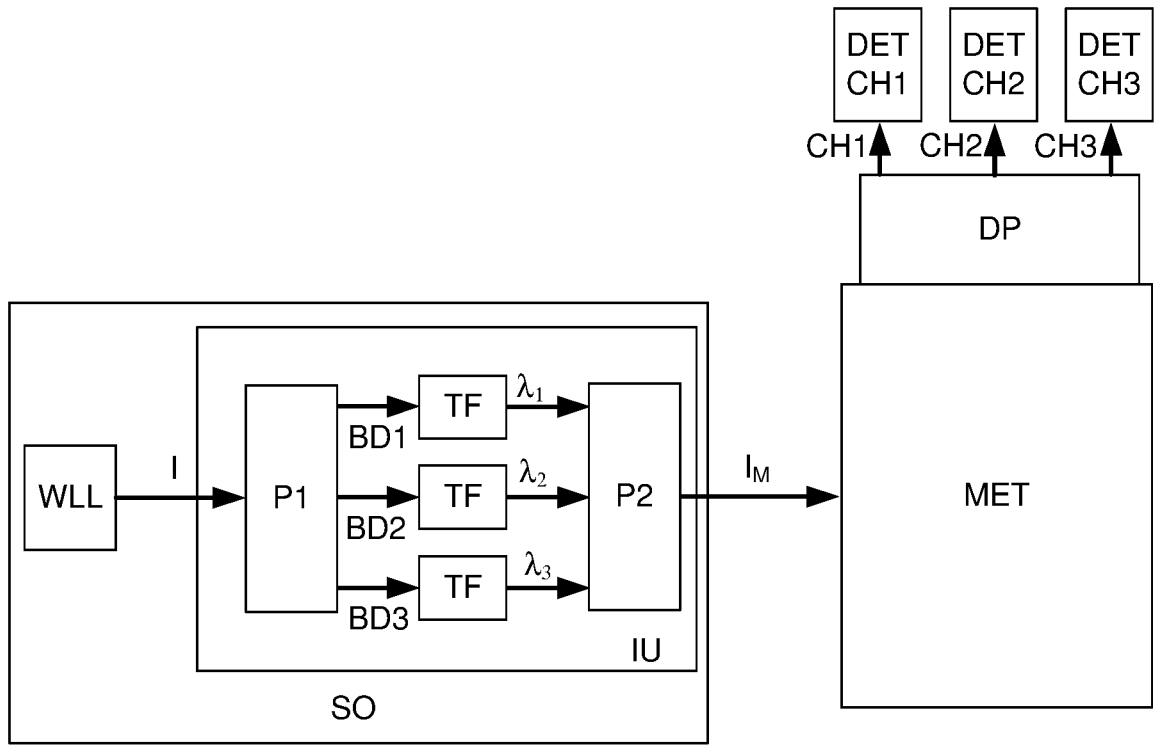
FIG. 6 is a schematic illustration of a metrology apparatus comprising an illumination and detection arrangement according to a second embodiment of the invention.

The concept described in relation to FIG. 5 can be implemented in a number of ways. FIG. 6 shows the arrangement of FIG. 5, with an exemplary specific arrangement for generating the illumination radiation $I_M$. A broadband or white light laser WLL generates illumination I. This illumination I is fed to an illumination unit IU, which comprises a first illumination beamsplitter or first illumination prism P1 that divides the spectrum of the illumination I between a plurality of sub-beams, each having a respective wavelength band (e.g., into first wavelength band BD1, second wavelength band BD2 and third wavelength band BD3). Each band may have the same bandwidth or one or more may have different bandwidths from the others. For example, the bandwidths may each be in the region of 50-200 nm wide. A tunable filter TF is provided for each band. Each tunable filter TF may comprise, for example, an acousto-optic tunable filter (AOTF) dedicated to (e.g., and optimized for operation within) a particular bandwidth. The tunable filter TF facilitates tuning for selection of an individual narrow band of wavelengths (e.g., of width 1-10 nm) within each band (e.g., having a respective wavelength peak $\lambda_1$, $\lambda_2$, $\lambda_3$). Since there is a dedicated tunable filter TF to produce each narrowband, the side-band suppression is very high and a smoother well controlled spectrum can be obtained. The filtered radiation (e.g., the filtered sub-beams) is then re-combined using a beam combiner or second illumination prism P2 to form the measurement illumination $I_M$. The result is a measurement illumination $I_M$ comprising a spectrum having sharp peaks with high sideband suppression. This measurement illumination $I_M$ is directed to the metrology device for target illumination.

Although AOTFs are preferred for the tunable filters TF, due to their fast switching speed, any other wavelength selection apparatus can be used to select the individual wavelengths; e.g., filter wheels. Each tunable filter/AOTF may be (optionally) optimized (e.g. crystal type, orientation, coatings etc.) in terms of its response to its corresponding wavelength band. Additionally, while FIGS. 5 and 6 each show how a three wavelength spectra can be created, this is purely an example and it will be apparent that the same method can be extended to any number of wavelengths and bands.

If the laser light source WLL comprises a supercontinuum laser or similar (e.g., generates a supercontinuum), then a single tunable filter TF or AOTF can be used to generate a spectra comprising multiple peaks. The downside of this approach is that the use of a single AOTF results in an increase in the sideband energy around the main peaks, which can cause process dependency errors. Therefore, while this single filter approach is within the scope of this disclosure, providing dedicated filters per band may be preferred.

At the detection side, a detection beamsplitter or detection prism DP is used to separate the scattered radiation from the target according to the wavelength bands BD1, BD2, BD3. At each output of the detection prism DP, there is provided a separate image detector DET CH1, DET CH2, DET CH3. Each image detector may be (optionally) optimized for its corresponding wavelength band. For example, wavelengths in a lower wavelength band (e.g., a range of 400-500 nm) can be detected with an image detector having a quantum efficiency QE optimized for lower wavelengths and similarly, wavelengths in a higher wavelength band (e.g., a range of 700-900 nm can be detected with an image detector having a quantum efficiency QE optimized for higher wavelengths. Alternatively or additionally, the detectors may be such that pixel sizes differ between the detectors; e.g., detector pixel size may be optimized per channel/band.

Each of the prisms P1, P2, DP may comprise a compound prism similar to a Philips prism. Philips prisms are used in broadcast cameras where R, G, B (red-green-blue) channels are detected on separate cameras. However, such compound prisms may be modified for the applications proposed herein. More specifically, edge pass coatings may be used on the splitting faces of the compound prism, instead of the bandpass coatings typically used on Philips prisms. Edge pass coatings are used so that particular wavelengths can be either reflected or transmitted forward into another channel. Edge pass filters are available having an edge transition region less than 5 nm wide; e.g., in the order of 1 nm wide.

Furthermore, optical path lengths of the channels may be optimized to compensate for the axial color response of the objective lens of the metrology apparatus. Typically, such objective lenses cannot focus all wavelengths at the same focal distance. Thus when multiple wavelengths are used to illuminate the object simultaneously, the resultant images are not all in focus at the same time. To compensate, the channel lengths of each band may be varied (e.g., by a few mms) such that each wavelength band is at optimum focus.

Figure 7:
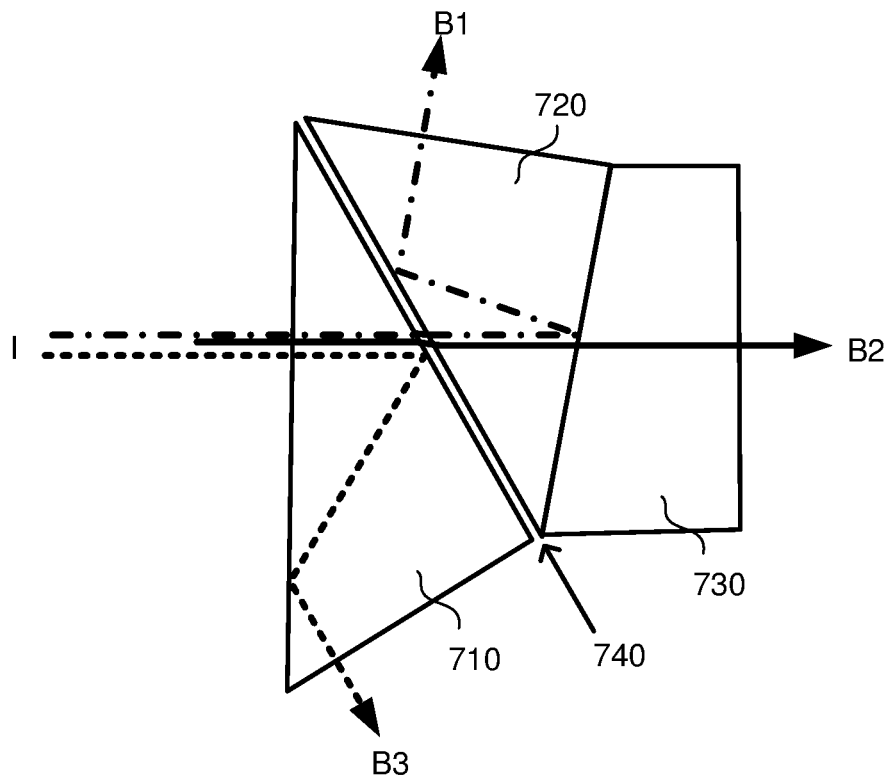
FIG. 7 is a schematic illustration of a first compound prism usable in the metrology apparatus of FIG. 5 or 6.

FIG. 7 illustrates a schematic example of a compound prism. This specific example shows a trichroic beamsplitter prism schematic, which splits an input beam I into a first beam B1 in a first wavelength band (e.g., band BD1), a second beam B2 in a second wavelength band (e.g., band BD2) and a third beam B3 in a third wavelength band (e.g., band BD3). Two triangular prism elements 710, 720 and one quadrilateral prism element 730 are cemented into an assembly. The two triangular prism elements 710, 720 have an air gap 740 between them. The quadrilateral prism element 730 is optically cemented to a face of one of the triangular prisms 720, opposite the air gap bonded face. Dichroic filter coatings, more specifically, edge pass coatings, are provided on the faces of the two triangular prisms. The first beam B1 and third beam B3 each undergo one total internal reflection at the air gap 740 and air/glass boundary respectively, while the other reflections are dichroic. Such a compound prism may be used as the prisms P1, P2, and DP in a 3 wavelength embodiment of the arrangement of FIG. 6.

Figure 8:
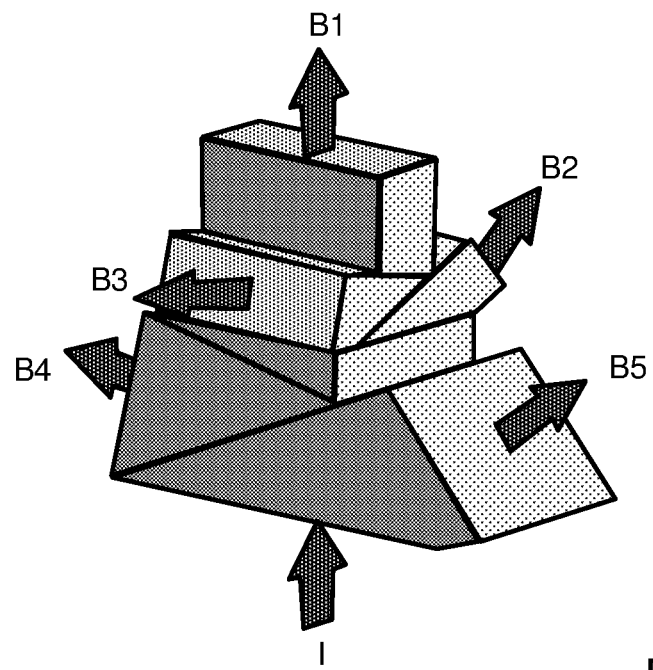
FIG. 8 is a schematic illustration of a second compound prism usable in the metrology apparatus of FIG. 5 or 6.

FIG. 8 illustrates a schematic example of an example compound prism for providing 5 beams: first beam B1 in a first wavelength band, second beam B2 in a second wavelength band, third beam B3 in a third wavelength band, fourth beam B4 in a fourth wavelength band, and fifth beam B5 in a fifth wavelength band. As before, edge pass coatings, are provided on the appropriate faces of the prism elements of this prism. Such a compound prism may be used as the prisms P1, P2, and DP in a 5 wavelength embodiment of the arrangement of FIG. 6. Other prism arrangements may be used to provide any number of different wavelength bands.

In use, the tunable filters TF can select a particular wavelength within each measurement band, for each detection channel. For example, such a method provides great flexibility in wavelength selection for dual wavelength measurements, such that most combinations of two wavelengths can be accommodated (e.g., provided that they are in different channels), even with only three bands/channels provided. Providing more bands/channels enables more combinations. Also, in each of such "dual wavelength" measurements (where there are more than two channels/bands), a simultaneous capture in the other channels will be obtained (e.g., at one or more additional wavelengths) which can also be used to make the measurement more robust.

If a particular (e.g., desired) wavelength happens to fall on a transition region between two bands, then it will be partially transmitted and reflected towards different image detectors. In this case, the images detected by these two sensors can be digitally aligned and added to recreate the original image corresponding to the desired wavelength. In another embodiment, a beam tilt mechanism can be included before the prisms so as to slightly tilt the beams entering the detection prism. This will cause the transition bands to shift slightly. Alternatively to tilting the beams, the prisms can be mounted on a tilt stage to produce the desired effect of shifting the transition bands. Another approach could be to equip the prisms with adjustable bandpass filters (e.g., on a filter wheel) to change the position of the edge of the edge filter.

It should be appreciated that the source SO of FIG. 5 may differ completely and in principle from the example provided in FIG. 6, and any arrangement which provides radiation in a plurality of discrete wavelength bands in parallel may be used. This may include combining the outputs of a number of single wavelength lasers for example; or using a different beamsplitting and/or filter arrangement on a broadband source than that described.

The above described illumination and detection arrangement can be used in combination with any suitable metrology apparatus which uses electromagnetic radiation to perform measurements, including inspection apparatuses and alignment apparatuses. In addition to the aforementioned scatterometer-type metrology apparatuses described above (and similar), such a method may be used in a metrology approach which employs a computational imaging/phase retrieval approach, such has been described in US patent publication US2019010778 (which is incorporated herein by reference). Such a metrology device may use relatively simple sensor optics with unexceptional or even relatively mediocre aberration performance. As such, the sensor optics may be allowed to have aberrations, and therefore produce a relatively aberrated image. Of course, simply allowing larger aberrations within the sensor optics will have an unacceptable impact on the image quality unless something is done to compensate for the effect of these optical aberrations. Therefore, computational imaging techniques are used to compensate for the negative effect of relaxation on aberration performance within the sensor optics. Such a computational imaging technique may comprise a phase retrieval technique, where the intensity and phase of the target is retrieved from one or multiple intensity measurements of the target. The phase retrieval may use prior information of the metrology target (e.g., for inclusion in a loss function that forms the starting point to derive/design the phase retrieval algorithm). Alternatively, or in combination with the prior information approach, diverse measurements may be made. In particular, one example of diversity comprises measurement of the target at different wavelengths, for which the concepts herein can facilitate with increased speed and throughput.

Another specific type of metrology sensor has recently been recently described in European applications EP18195488.4 and EP19150245.9, which are incorporated herein by reference, for which the concepts disclosed herein may be used. This metrology sensor has both alignment and product/process monitoring metrology applications. The metrology device is configured to produce a illumination with optimized coherence in that the illumination comprises a plurality of spatially incoherent beams of measurement illumination, each of said beams (or both beams of measurement pairs of said beams, each measurement pair corresponding to a measurement direction) having corresponding regions within their cross-section for which the phase relationship between the beams at these regions is known; i.e., there is mutual spatial coherence for the corresponding regions. As such, each direction pair of beams is spatially incoherent except for the corresponding small regions of coherence (e.g., corresponding to about the size of a pixel). This provides the advantages of both spatially coherent illumination (no speckle) and spatially incoherent radiation (facilitating darkfield off-axis imaging on small gratings).

Other metrology technologies for which the concepts disclosed herein are also applicable include one or more of: In-Device Metrology (IDM), reconstruction metrology (e.g., based on angle resolved measurements or otherwise), diffraction based overlay (DBO) technologies, and alignment sensors.

Further embodiments are disclosed in the subsequent numbered clauses:

1. An illumination and detection apparatus for a metrology tool, comprising:
   an illumination arrangement operable to produce measurement illumination comprising a plurality of discrete wavelength bands and comprising a spectrum having no more than a single peak within each wavelength band; and
   a detection arrangement comprising:
   a detection beamsplitter to split scattered radiation into a plurality of channels, each channel corresponding to a different one of said wavelength bands; and
   at least one detector for separate detection of each channel.
2. An illumination and detection apparatus as defined in clause 1, comprising a separate detector for each channel.
3. An illumination and detection apparatus as defined in clause 2, wherein each detector comprises an image sensor.
4. An illumination and detection apparatus as defined in clause 2 or 3, wherein each detector is optimized for its respective wavelength band.
5. An illumination and detection apparatus as defined in any preceding clause, wherein the illumination arrangement comprises: an illumination beamsplitter to split an input beam into a plurality of sub-beams, each sub-beam having a peak wavelength within a respective one of said discrete wavelength bands;
   a tuning arrangement for individually tuning the spectrum of each sub-beam within its respective wavelength band; and
   a beam combiner for combining said sub-beams into a beam of said measurement illumination.
6. An illumination and detection apparatus as defined in clause 5, wherein the tuning arrangement comprises a respective tunable filter for each sub-beam, being operable to tune the spectral position of said peak wavelength within each respective wavelength band.
7. An illumination and detection apparatus as defined in clause 6, wherein each tunable filter comprises an acousto-optic tunable filter.
8. An illumination and detection apparatus as defined in clause 6, wherein each tunable filter comprises a filter wheel or movable filter arrangement.
9. An illumination and detection apparatus as defined in clause 6, 7 or 8, wherein each tunable filter is optimized for its respective wavelength band.
10. An illumination and detection apparatus as defined in any of clauses 5 to 9, wherein said detection beamsplitter, illumination beamsplitter and beam combiner each comprise a compound prism arrangement comprising two or more prism elements defining:
    an input face receiving for broadband illumination;
    a plurality of output faces for outputting radiation in respective ones of each of said wavelength bands; and
    splitting faces in an optical path between said input face and at least one of said output faces for splitting an incident beam thereon according to wavelength;
    wherein said splitting faces comprise edge pass filter coatings.
11. An illumination and detection apparatus as defined in clause 10, wherein the compound prisms each comprise an adjustable filter arrangement to alter the position of a transition region between at least two of said wavelength bands.
12. An illumination and detection apparatus as defined in any preceding clause, wherein each peak defines a narrowband of wavelengths within each wavelength band.
13. An illumination and detection apparatus as defined in clause 12, wherein the narrowband of wavelengths is less than 10 nm wide.
14. An illumination and detection apparatus as defined in any preceding clause, wherein each wavelength band is between 50 nm to 200 nm wide.
15. An illumination and detection apparatus as defined in any preceding clause, wherein the number of discrete wavelength bands and the number of corresponding channels are each greater than two.
16. An illumination and detection apparatus as defined in any preceding clause, wherein the number of discrete wavelength bands and the number of corresponding channels are each greater than three.
17. An illumination and detection apparatus as defined in any preceding clause, wherein the detection arrangement is such that the paths lengths for each of said channels is individually optimized for best focus for each wavelength band.
18. An illumination and detection apparatus as defined in any preceding clause, comprising a beam tilt mechanism to tilt the scattered radiation prior to entering the detection beamsplitter, so as to alter the position of a transition region between at least two of said wavelength bands.
19. An illumination and detection apparatus as defined in any preceding clause, comprising a broadband radiation source for providing broadband radiation to the illumination arrangement,
20. An illumination and detection apparatus as defined in any preceding clause, wherein a transition band between two channels is less than 5 nm.
21. An illumination and detection apparatus as defined in any preceding clause, operable to separately detect radiation in each channel in parallel, thereby detecting in parallel said scattered radiation corresponding to each of said wavelength bands.
22. A metrology tool comprising the illumination and detection apparatus of any preceding clause.
23. A metrology tool as defined in clause 22, comprising:
    a substrate holder for holding a substrate comprising a structure,
    projection optics for projecting said measurement illumination onto the structure;
    detection optics for capturing the scattered radiation resultant from said measurement illumination having been scattered by the structure.
24. A metrology tool as defined in clause 23, wherein the projection optics and detection optics comprise at least some common optical elements.
25. A metrology tool as defined in 23 or 24 any of clauses 20 to 24, being operable to perform measurements of said structure simultaneously in each of said wavelength bands.
26. A metrology tool as defined in any of clauses 23 to 25, further comprising a processor operable to calculate a value for parameter of interest relating to the structure or its position based on one or more characteristics of the scattered radiation.
27. A metrology tool as defined in any of clauses 23 to 26, wherein, where a peak wavelength of at least one of said wavelength band falls on a transition region between two wavelength bands, the metrology tool is operable to separately detect the scattered radiation corresponding to said peak wavelength in two channels corresponding to each of said two wavelength bands; and said processor is operable process said scattered radiation corresponding to said peak wavelength to create a single image for said peak wavelength.

28. An illumination apparatus for a metrology tool and being operable to produce measurement illumination comprising a plurality of discrete wavelength bands and comprising a spectrum having no more than a single peak within each wavelength band; the illumination apparatus comprising:
an illumination beamsplitter to split an input beam into a plurality of sub-beams, each sub-beam having a peak wavelength within a respective one of said discrete wavelength bands;
a tuning arrangement for individually tuning the spectrum of each sub-beam within its respective wavelength band; and
a beam combiner for combining said sub-beams into a beam of said measurement illumination.

29. An illumination apparatus as defined in clause 28, wherein the tuning arrangement comprises a respective tunable filter for each sub-beam, being operable to tune the spectral position of said peak wavelength within each respective wavelength band.

30. An illumination apparatus as defined in clause 29, wherein each tunable filter comprises an acousto-optic tunable filter.

31. An illumination apparatus as defined in clause 29, wherein each tunable filter comprises a filter wheel or movable filter arrangement.

32. An illumination apparatus as defined in clause 29, 30 or 31, wherein each tunable filter is optimized for its respective wavelength band.

33. An illumination apparatus as defined in any of clauses 28 to 32, wherein said detection beamsplitter, illumination beamsplitter and beam combiner each comprise a compound prism arrangement comprising two or more prism elements defining:
an input face for receiving broadband illumination;
a plurality of output faces for outputting radiation in respective ones of each of said wavelength bands; and
splitting faces in an optical path between said input face and at least one of said output faces for splitting an incident beam thereon according to wavelength;
wherein said splitting faces comprise edge pass filter coatings.

34. An illumination apparatus as defined in clause 33, wherein the compound prisms comprise an adjustable filter arrangement to alter the position of a transition region between at least two of said wavelength bands.

35. An illumination apparatus as defined in any of clauses 28 to 34, wherein each peak defines a narrowband of wavelengths within each wavelength band.

36. An illumination apparatus as defined in clause 35, wherein the narrowband of wavelengths is less than 10 nm wide.

37. An illumination apparatus as defined in any of clauses 28 to 36, wherein each wavelength band is between 50 nm to 200 mn wide.

38. An illumination apparatus as defined in any of clauses 28 to 37, wherein the number of discrete wavelength bands and the number of corresponding channels are each greater than two.

39. An illumination apparatus as defined in any of clauses 28 to 37, wherein the number of discrete wavelength bands and the number of corresponding channels are each greater than three.

40. A compound prism arrangement for outputting radiation in a plurality of different wavelength bands comprising two or more prism elements defining:
an input face for receiving broadband illumination;
a plurality of output faces for outputting radiation in respective ones of each of said wavelength bands; and
splitting faces in an optical path between said input face and at least one of said output faces for splitting an incident beam thereon according to wavelength;
wherein said splitting faces comprise edge pass filter coatings.

41. A method for performing a measurement of a structure with measurement illumination comprising a plurality of discrete wavelength bands and comprising a spectrum having no more than a single peak within each wavelength band; the method comprising:
splitting a broadband radiation beam into a plurality of sub-beams, each having a respective wavelength band;
individually tuning each of the wavelength bands to form and locate said peak within its respective wavelength band;
combining the sub-beams into a beam of measurement radiation;
measuring the structure with the measurement radiation; and
capturing the scattered radiation, having been scattered by the structure.

42. A method as defined in clause 41, further comprising:
splitting the captured scattered radiation into a plurality of channels, each channel corresponding to a different one of said wavelength bands; and
individually detecting each channel on a respective detector.

43. A method as defined in clause 41 or 42, wherein each peak defines a narrowband of wavelengths within each wavelength band.

44. A method as defined in clause 43, wherein the narrowband of wavelengths is less than 10 nm wide.

45. A method as defined in any of clauses 41 to 44, wherein each wavelength band is between 50 nm to 200 mn wide.

46. A method as defined in any of clauses 41 to 45, wherein the number of discrete wavelength bands are each greater than two.

47. A method as defined in any of clauses 41 to 45, wherein the number of discrete wavelength bands are each greater than three.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of an inspection or metrology apparatus, embodiments of the invention may be used in other apparatus. Embodiments of the invention may form part of a mask inspection apparatus, a lithographic apparatus, or any apparatus that measures or processes an object such as a wafer (or other substrate) or mask (or other patterning device). The term "metrology apparatus" may also refer to an inspection apparatus or an inspection system. E.g. the inspection apparatus that comprises an embodiment of the invention may be used to detect defects of a substrate or defects of structures on a substrate. In such an embodiment, a characteristic of interest of the structure on the substrate may relate to defects in the structure, the absence of a specific part of the structure, or the presence of an unwanted structure on the substrate.

Although specific reference may have been made above to the use of embodiments of the invention in the context of optical lithography, it will be appreciated that the invention, where the context allows, is not limited to optical lithography and may be used in other applications, for example imprint lithography.

While the targets or target structures (more generally structures on a substrate) described above are metrology target structures specifically designed and formed for the purposes of measurement, in other embodiments, properties of interest may be measured on one or more structures which are functional parts of devices formed on the substrate. Many devices have regular, grating-like structures. The terms structure, target grating and target structure as used herein do not require that the structure has been provided specifically for the measurement being performed. Further, pitch P of the metrology targets may be close to the resolution limit of the optical system of the scatterometer or may be smaller, but may be much larger than the dimension of typical product features made by lithographic process in the target portions C. In practice the lines and/or spaces of the overlay gratings within the target structures may be made to include smaller structures similar in dimension to the product features.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. An illumination and detection apparatus for a metrology tool, the apparatus comprising:
    an illumination arrangement comprising an illumination beamsplitter to split an input beam into a plurality of sub-beams for simultaneous incidence of radiation from each sub-beam as measurement illumination on a surface to be inspected or measured, each sub-beam associated with a different discrete wavelength band and comprising a spectrum having no more than a single peak within each wavelength band; and
    a detection arrangement comprising:
        a detection beamsplitter to split scattered radiation from the plurality of sub-beams into a plurality of channels, each channel corresponding to a different one of the wavelength bands; and
        at least one detector for separate detection of each channel.

2. The apparatus as claimed in claim 1, comprising a separate detector for each channel.

3. The apparatus as claimed in claim 2, wherein each detector comprises an image sensor.

4. The apparatus as claimed in claim 2, wherein each detector is optimized for its respective wavelength band.

5. The apparatus as claimed in claim 1, wherein the illumination arrangement comprises:
    a tuning arrangement configured to individually tune the spectrum of each sub-beam within its respective wavelength band; and
    a beam combiner configured to combine the sub-beams into a beam of the measurement illumination.

6. The apparatus as claimed in claim 5, wherein the tuning arrangement comprises a respective tunable filter, for each sub-beam, configured to tune the spectral position of a peak wavelength within each respective wavelength band.

7. The apparatus as claimed in claim 6, wherein each tunable filter comprises an acousto-optic tunable filter or a filter wheel or movable filter arrangement.

8. The apparatus as claimed in claim 5, wherein the detection beamsplitter, illumination beamsplitter and beam combiner each comprise a compound prism arrangement comprising two or more prism elements defining:
    an input face for receiving broadband illumination;
    a plurality of output faces for outputting radiation in respective ones of each of the wavelength bands; and
    splitting faces in an optical path between the input face and at least one of the output faces for splitting an incident beam thereon according to wavelength,
    wherein the splitting faces comprise edge pass filter coatings.

9. The apparatus as claimed in claim 8, wherein the compound prism arrangements each comprise an adjustable filter arrangement to alter the position of a transition region between at least two of the wavelength bands.

10. The apparatus as claimed in claim 1, further comprising a broadband radiation source for providing broadband radiation to the illumination arrangement.

11. The apparatus as claimed in claim 1, configured to separately detect radiation in each channel in parallel, thereby detecting in parallel the scattered radiation corresponding to each of the wavelength bands.

12. A metrology tool comprising the illumination and detection apparatus of claim 1.

13. An illumination apparatus for a metrology tool and being operable to produce measurement illumination comprising a plurality of different discrete wavelength bands and comprising a spectrum having no more than a single peak within each wavelength band, the illumination apparatus comprising:
    an illumination beamsplitter to split an input beam into a plurality of sub-beams;
    a tuning arrangement comprising a tunable filter and configured to individually tune the wavelength spectrum and the spectral position of a peak wavelength of the single peak for each of the different discrete wavelength bands so that each sub-beam has its own respective different discrete wavelength band of the plurality of different discrete wavelength bands; and
    a beam combiner configured to combine the sub-beams into a beam of the measurement illumination.

14. A compound prism arrangement for outputting radiation in a plurality of different wavelength bands, the compound prism arrangement comprising two or more prism elements defining:
    an input face for receiving broadband illumination comprising a plurality of wavelengths;
    a plurality of output faces for outputting radiation from the broadband illumination in respective ones of each of the different wavelength bands; and
    splitting faces in an optical path between the input face and at least one of the output faces, the splitting faces configured to split broadband illumination input to a single input face according to wavelength to at least two of the output faces to output respective different wavelength bands formed from the plurality of wavelengths of the broadband illumination input to the single input face,
    wherein the splitting faces comprise edge pass filter coatings.

15. A method for performing a measurement of a structure with measurement illumination comprising a plurality of different discrete wavelength bands and comprising a spectrum having no more than a single peak within each wavelength band, the method comprising:

splitting a broadband radiation beam into a plurality of sub-beams;

using a tunable filter, individually tuning the wavelength spectrum and the spectral position of a peak wavelength of the single peak for each of the different discrete wavelength bands so that each sub-beam has its own respective different discrete wavelength band of the plurality of different discrete wavelength bands;

combining the sub-beams into a beam of measurement radiation;

measuring the structure with the measurement radiation; and capturing the scattered radiation, having been scattered by the structure.

16. The apparatus as claimed in claim 13, wherein the tuning arrangement comprises a respective tunable filter for each sub-beam.

17. The apparatus as claimed in claim 16, wherein each tunable filter comprises an acousto-optic tunable filter or a filter wheel or movable filter arrangement.

18. The apparatus as claimed in claim 13, wherein the detection beamsplitter, illumination beamsplitter and/or beam combiner comprises a compound prism arrangement comprising two or more prism elements defining:

an input face for receiving broadband illumination;

a plurality of output faces for outputting radiation in respective ones of each of the wavelength bands; and splitting faces in an optical path between the input face and at least one of the output faces for splitting an incident beam thereon according to wavelength, wherein the splitting faces comprise edge pass filter coatings.

19. The apparatus as claimed in claim 18, wherein each compound prism arrangement comprises an adjustable filter arrangement to alter the position of a transition region between at least two of the wavelength bands.

20. The compound prism arrangement as claimed in claim 14, further comprising an adjustable filter arrangement to alter the position of a transition region between at least two of the wavelength bands.

* * * * *